United States Patent
Kim et al.

(10) Patent No.: US 11,575,084 B2
(45) Date of Patent: Feb. 7, 2023

(54) VARIABLE RESISTANCE MEMORY DEVICE

(71) Applicant: Samsung Electronics Co., Ltd., Suwon-si (KR)

(72) Inventors: Seyun Kim, Seoul (KR); Jinhong Kim, Seoul (KR); Soichiro Mizusaki, Suwon-si (KR); Jungho Yoon, Yongin-si (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 118 days.

(21) Appl. No.: 16/999,285

(22) Filed: Aug. 21, 2020

(65) Prior Publication Data
US 2021/0202840 A1 Jul. 1, 2021

(30) Foreign Application Priority Data

Dec. 27, 2019 (KR) .................. 10-2019-0176732

(51) Int. Cl.
*H01L 45/00* (2006.01)
*H01L 27/24* (2006.01)

(52) U.S. Cl.
CPC ........ *H01L 45/146* (2013.01); *H01L 27/2436* (2013.01); *H01L 27/2454* (2013.01);
(Continued)

(58) Field of Classification Search
CPC ............... H01L 45/146; H01L 27/2436; H01L 27/2454; H01L 27/2472; H01L 27/2481;
(Continued)

(56) References Cited

U.S. PATENT DOCUMENTS

2008/0149913 A1* 6/2008 Tanaka ................ H01L 27/2481
438/238
2013/0328005 A1 12/2013 Shin et al.
(Continued)

FOREIGN PATENT DOCUMENTS

EP 2141753 A2 1/2010
EP 3163642 A1 5/2017
(Continued)

OTHER PUBLICATIONS

Sven Dirkmann et al., 'Filament growth and resistive switching in hafnium oxide memristive devices' *ACS Applied Materials and Interfaces*, Mar. 2018.
(Continued)

*Primary Examiner* — Selim U Ahmed
(74) *Attorney, Agent, or Firm* — Harness, Dickey & Pierce, P.L.C.

(57) ABSTRACT

A variable resistance memory device includes a variable resistance layer, a first conductive element, and a second conductive element. The variable resistance layer includes a first layer and a second layer. The first layer is formed of a first material. The second layer is on the first layer and formed of a second material having a density different from a density of the first material. The first conductive element and a second conductive element are located on the variable resistance layer and spaced apart from each other in order to form a current path in the variable resistance layer. The current path is in a direction perpendicular to a direction in which the first layer and the second layer are stacked.

25 Claims, 12 Drawing Sheets

(52) U.S. Cl.
CPC ...... *H01L 27/2472* (2013.01); *H01L 27/2481* (2013.01); *H01L 45/08* (2013.01)

(58) Field of Classification Search
CPC ... H01L 45/08; H01L 45/1226; H01L 45/124; H01L 45/1206; H01L 45/145; H01L 45/122
See application file for complete search history.

(56) References Cited

U.S. PATENT DOCUMENTS

| | | |
|---|---|---|
| 2014/0145137 A1 | 5/2014 | Ju et al. |
| 2016/0149130 A1 | 5/2016 | Wang et al. |
| 2016/0163981 A1* | 6/2016 | Toriyama ........... G11C 13/0023 257/5 |
| 2018/0269391 A1* | 9/2018 | Seki ...................... H01L 27/249 |
| 2019/0088318 A1* | 3/2019 | Morooka ............ H01L 45/1226 |
| 2021/0202833 A1 | 7/2021 | Kim et al. |

FOREIGN PATENT DOCUMENTS

| | | |
|---|---|---|
| KR | 20110024479 A | 3/2011 |
| KR | 2021-0083933 A | 7/2021 |

OTHER PUBLICATIONS

Kanghoon Yim et al., 'Novel high-κ dielectrics for next-generation electronic devices screened by automated *ab initio* calculations' *NPG Asia Materials*, 7, Jun. 2015.

Extended European Search Report dated May 12, 2021, issued in corresponding European Patent Application No. 20217221.9.

\* cited by examiner

VARIABLE RESISTANCE MEMORY DEVICE

CROSS-REFERENCE TO RELATED APPLICATION

This application claims the benefit of Korean Patent Application No. 10-2019-0176732, filed on Dec. 27, 2019, in the Korean Intellectual Property Office, the disclosure of which is incorporated herein in its entirety by reference.

BACKGROUND

1. Field

The present disclosure relates to a nonvolatile memory device using a variable resistance material.

2. Description of Related Art

A non-volatile memory apparatus is a semiconductor memory apparatus in which stored data is not destroyed even when power supply is interrupted, and examples of non-volatile memory apparatus include programmable read-only memory (PROM), erasable PROM (EPROM), electrically EPROM (EEPROM), and flash memory.

In accordance with the demand for technology having high integration, low power consumption, and capability of random access to a memory cell, next-generation semiconductor memory apparatuses such as magnetic random-access memory (MRAM) and phase-change random-access memory (PRAM) have recently been developed.

Such next-generation semiconductor memory apparatuses employ resistive switching devices having resistance values that vary according to applied current or voltage and remain unchanged even when current or voltage supply is interrupted. For high integration and low power consumption, resistive switching of the resistance switching devices at a low applied voltage and a wide resistive switching range may be desired.

SUMMARY

Provided are variable resistance memory devices having improved variable resistance performance.

Additional aspects will be set forth in part in the description which follows and, in part, will be apparent from the description, or may be learned by practice of the presented embodiments of the disclosure.

According to an embodiment, a variable resistance memory device includes a variable resistance layer including a first layer and a second layer, the first layer formed of a first material, the second layer on the first layer, the second layer formed of a second material having a density different from a density of the first material; and a first conductive element and a second conductive element on the variable resistance layer and spaced apart from each other in order to form a current path in the variable resistance layer in a direction perpendicular to a direction in which the first layer and the second layer are stacked.

In some embodiments, the density of the second material may be higher than the density of the first material.

In some embodiments, a density difference between the first material and the second material may be greater than 1 $g/cm^3$.

In some embodiments, the variable resistance layer may further include a third layer on the second layer. The third layer may be formed of a third material having a density lower than the density of the second material.

In some embodiments, a density difference between the second material and the third material may be greater than 1 $g/cm^3$.

In some embodiments, the first material and the third material may be the same material.

In some embodiments, a thickness of the second layer may be less than a thickness of the first layer and the thickness of the second layer may be less than a thickness of the third layer.

In some embodiments, each of the first material and the second material may be an oxide having a bandgap energy of 2 eV or more.

In some embodiments, each of the first material and the second material independently may be any one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$.

In some embodiments, the first material and the second material may have a same valence, and a density difference between the first material and the second material may be greater than 1.5 $g/cm^3$.

In some embodiments, the first material may be $HfO_2$, and the second material may be $TiO_2$, $MnO_2$, $ZrO_2$, or $Cr_2O_3$.

In some embodiments, the first material may be $Gd_2O_3$, and the second material may be $Cr_2O_3$ or $La_2O_3$.

In some embodiments, the first material may be $NiO$, and the second material may be $SrO$, $CaO$, or $BeO$.

In some embodiments, the first material may be $WO_3$, and the second material may be $MoO_3$.

According to an embodiment, a variable resistance memory device includes an insulating layer; a variable resistance layer on the insulating layer, the variable resistance layer including a first layer and a second layer, the first layer formed of a first material, the second layer on the first layer and formed of a second material, a density of the second material being different than a density of the first material; a channel layer on the variable resistance layer; a gate insulating layer on the channel layer; and a plurality of gate electrodes spaced apart from one another on the gate insulating layer.

In some embodiments, the density of the second material may be higher than the density of the first material.

In some embodiments, a density difference between the first material and the second material may be greater than 1 $g/cm^3$.

In some embodiments, the variable resistance layer may further include a third layer on the second layer and formed of a third material. A density of the third material may be lower than the density of the second material.

In some embodiments, a thickness of each of the first layer, the second layer, and the third layer may be equal to or less than 10 nm.

In some embodiments, the second layer may have a thickness equal to or less than 2 nm.

In some embodiments, the third layer may contact the channel layer and may have a thickness equal to or greater than 5 nm.

In some embodiments, a density difference between the second material and the third material may be greater than 1 $g/cm^3$.

In some embodiments, the first material and the third material may be the same material.

In some embodiments, each of the first material and the second material may be an oxide having a bandgap energy of 2 eV or more.

In some embodiments, each of the first material and the second material independently may be any one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$.

According to an embodiment, a variable resistance memory device includes a variable resistance layer including a first layer and a second layer, the first layer including a first material, the second layer on the first layer, the second layer including a second material having a density different from a density of the first material; and a first conductive element and a second conductive element on the variable resistance layer and spaced apart from each other in order to form a current path in the variable resistance layer in a direction perpendicular to a direction in which the first layer and the second layer are stacked.

In some embodiments, the first material may be $HfO_2$, and the second material may be $TiO_2$, $MnO_2$, $ZrO_2$, or $Cr_2O_3$.

In some embodiments, the first material may be $Gd_2O_3$, and the second material may be $Cr_2O_3$ or $La_2O_3$.

In some embodiments, the first material may be $NiO$, and the second material may be $SrO$, $CaO$, or $BeO$.

In some embodiments, the first material may be $WO_3$, and the second material may be $MoO_3$.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
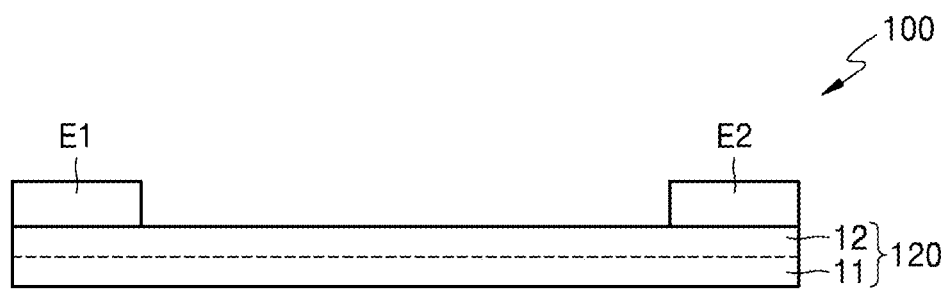
FIG. 1 is a cross-sectional view illustrating a structure of a variable resistance memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

The present disclosure will now be described more fully with reference to the accompanying drawings, in which embodiments are shown. Also, embodiments of the present disclosure are described, and various modifications may be made from the embodiments of the present disclosure. The same reference numerals in the drawings denote the same elements, and sizes of elements in the drawings may be exaggerated for clarity and convenience of explanation.

When an element is referred to as being "on" another element, it may be directly on the other element, or intervening elements may be present therebetween.

While such terms as "first," "second," etc., may be used to describe various components, the above terms are used only to distinguish one component from another The terms do not mean that materials or structures of elements are different.

The singular forms "a," "an," and "the" are intended to include the plural forms as well, unless the context clearly indicates otherwise. When a portion "includes" an element, another element may be further included, rather than excluding the existence of the other element, unless otherwise described.

The terms such as "unit" or "module" refer to units that perform at least one function or operation, and the units may be implemented as hardware or software or as a combination of hardware and software.

The use of the terms "a" and "an," and "the" and similar referents in the context of describing the present disclosure is to be construed to cover both the singular and the plural.

The steps of all methods described herein may be performed in any suitable order unless otherwise indicated herein or otherwise clearly contradicted by context. The use of any and all examples, or example language (e.g., "such as") provided herein, is intended merely to describe the present disclosure in detail and does not pose a limitation on the scope of the present disclosure unless otherwise claimed.

Figure 2:
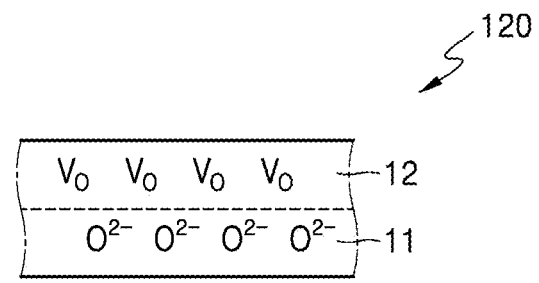
FIG. 2 is a conceptual view for describing the principle of resistance variation occurring in a variable resistance layer provided in the variable resistance memory device of FIG. 1.

FIG. 1 is a cross-sectional view illustrating a structure of a variable resistance memory device according to an embodiment. FIG. 2 is a conceptual view for describing the principle of resistance variation occurring in a variable resistance layer provided in the variable resistance device of FIG. 1.

Referring to FIG. 1, a variable resistance memory device 100 includes a variable resistance layer 120 that includes a first layer 11 and a second layer 12, and a first conductive element E1 and a second conductive element E2 that apply a voltage to the variable resistance layer 120.

The variable resistance layer 120 includes the first layer 11 formed of a first material, and the second layer 12 located on the first layer 11 and formed of a second material having a density different from that of the first material. The first layer 11 may have a density higher than that of the second layer 12.

The first conductive element E1 and the second conductive element E2 may be located on both ends of the variable resistance layer 120, to form a current path in the variable resistance layer 120, in a horizontal direction, that is, a direction perpendicular to a direction in which the first layer 11 and the second layer 12 are stacked, when a voltage is applied. The first conductive element E1 and the second conductive element E2 may be formed to contact both ends of the second layer 12. However, this is merely an example, and the first conductive element E1 and the second conductive element E2 may be formed to contact both ends of the first layer 11.

The variable resistance layer 120 is a layer having resistance characteristics that vary according to an applied voltage. The resistance characteristics of the variable resistance layer 120 depend on whether a conductive filament is formed due to a behavior of oxygen occurring in the variable resistance layer 120 according to a voltage applied to the first conductive element E1 and the second conductive element E2 formed on the variable resistance layer 120. According to whether the conductive filament is formed, the variable resistance layer 120 may have a low-resistance state or a high-resistance state, and information '1' or '0' is accordingly written. An applied voltage for changing the variable resistance layer 120 from a high-resistance state to a low-resistance state is referred to as a set voltage $V_{set}$, an applied voltage for changing the variable resistance layer 120 from a low-resistance state to a high-resistance state is referred to as a reset voltage $V_{reset}$, and the variable resistance memory device 100 according to an embodiment includes the variable resistance layer 120 configured to have a low set voltage.

Referring to FIG. 2, when current flows between both ends of the variable resistance layer 120 due to an applied voltage, oxygen vacancies ($V_o$) and interstitial oxygen ions ($O^{2-}$) are formed. The oxygen vacancies ($V_o$) gather to form a conductive filament, and a resistance of the variable resistance layer 120 is reduced due to the conductive filament.

When a conductive filament is easily formed even at a low voltage, and a resistance difference between a low-resistance state and a high-resistance state occurring due to an applied voltage is large, variable resistance performance is excellent.

To this end, the oxygen vacancies ($V_o$) have to be easily formed in the variable resistance layer 120. As in an embodiment, when the variable resistance layer 120 has a multi-layer structure in which the first layer 11 having a low density and the second layer 12 having a high density are adjacent to each other, because oxides having a low density have a wider space between atoms than oxides having a high density, the oxygen ions ($O^{2-}$) may be more smoothly diffused from the first layer 11 to the second layer 12. Once the oxygen ions ($O^{2-}$) are diffused from the first layer 11 to the second layer 12, the oxygen vacancies ($V_o$) may gather in the first layer 11 and a conductive filament may be easily formed.

When the variable resistance layer 120 is configured as described above, a desired resistive switching range may be guaranteed with a low thickness when compared to an existing charge trap-based variable resistance device or a variable resistance device using a phase change material. Each of the first layer 11 and the second layer 12 constituting the variable resistance layer 120 may have a thickness equal to or less than 10 nm (e.g., greater than 0 nm and less than or equal to 10 nm).

The first material and the second material included in the variable resistance layer 120 may be formed of any of various oxides. For example, each of the first material and the second material may include an oxide of at least one element selected from the group consisting of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr), and silicon (Si). An oxide having a bandgap energy of 2 eV or more may be used for each of the first material and the second material, and for example, any one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$ may be used for each of the first material and the second material.

Densities of the above materials are shown in Table 1.

TABLE 1

| Composition | Density (g/cm$^3$) |
| --- | --- |
| $Rb_2O$ | 4 |
| $TiO_2$ | 4.23 |
| $BaO$ | 5.72 |
| $ZrO_2$ | 5.68 |
| $HfO_2$ | 9.68 |
| $CaO$ | 3.34 |
| $SrO$ | 4.7 |
| $Sc_2O_3$ | 3.86 |
| $MgO$ | 3.58 |
| $Al_2O_3$ | 3.95 |
| $SiO_2$ | 2.65 |
| $BeO$ | 3.02 |
| $Nb_2O_5$ | 4.6 |
| $NiO$ | 6.67 |
| $Ta_2O_5$ | 8.2 |
| $WO_3$ | 7.16 |
| $V_2O_5$ | 3.36 |
| $La_2O_3$ | 6.51 |
| $Gd_2O_3$ | 7.41 |
| $CuO$ | 6.31 |
| $MoO_3$ | 4.69 |
| $Cr_2O_3$ | 5.22 |
| $MnO_2$ | 5.03 |

Referring to Table 1, the first layer 11 may be formed of a material having a low density, and the second layer 12 may be formed by selecting a material having a relatively high density. A density difference between the first layer 11 and the second layer 12 may be set, to smoothly diffuse oxygen ions and easily form a conductive filament due to oxygen vacancies. For example, materials of the first layer 11 and the second layer 12 may be set, so that a density difference between the first layer 11 and the second layer 12 is greater than 1 g/cm$^3$. Because oxygen ions may be more smoothly diffused as a density difference is larger, materials of the first layer 11 and the second layer 12 may be set so that a density difference is greater than 1.5 g/cm$^3$ or greater than 2 g/cm$^3$. For example, the first layer 11 may include SiO$_2$, and the second layer 12 may include HfO$_2$. In addition, any of the following combinations may be used.

TABLE 2

| First Material (Second Material) | First Material (Second Material) |
|---|---|
| HfO$_2$ | TiO$_2$ |
| HfO$_2$ | MnO$_2$ |
| HfO$_2$ | ZrO$_2$ |
| HfO$_2$ | SiO$_2$ |
| Gd$_2$O$_3$ | Cr$_2$O$_3$ |
| Gd$_2$O$_3$ | La$_2$O$_3$ |
| NiO | SrO |
| NiO | CaO |
| NiO | BeO |
| WO$_3$ | MoO$_3$ |

As shown in each of the above combinations, the first material and the second material having the same valence may be selected so that a density difference is greater than 1 g/cm$^3$. For example, HfO$_2$/TiO$_2$, HfO$_2$/MnO$_2$, HfO$_2$/ZrO$_2$, or HfO$_2$/SiO$_2$ may be selected as a combination of materials having a valence of 4. A density difference of the above combinations may be greater than 4 g/cm$^3$. Gd$_2$O$_3$/Cr$_2$O$_3$, or Gd$_2$O$_3$/La$_2$O$_3$ may be selected as a combination of materials having a valence of 3. A density difference of the combinations may be greater than 2 g/cm$^3$. NiO/SrO, NiO/CaO, or NiO/BeO may be selected as a combination of materials having a valence of 2, and a density difference of the combinations may be greater than 1.5 g/cm$^3$. WO$_3$/MoO$_3$ may be selected as a combination of materials having a valence of 6. However, the present disclosure is not limited to the above combinations, and materials having different valences and having a density difference equal to or greater than 1 g/cm$^3$ may be selected.

Figure 3:
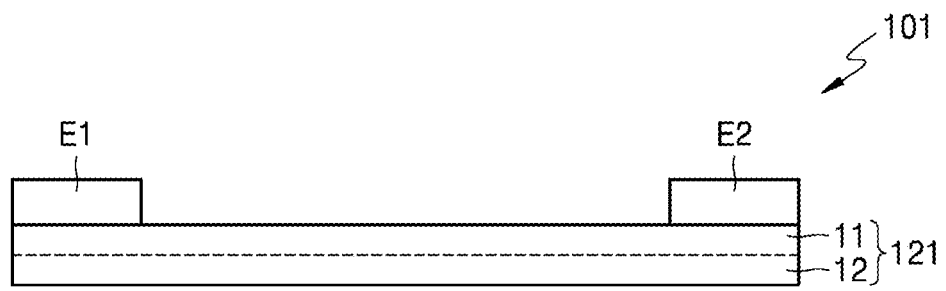
FIG. 3 is a cross-sectional view illustrating a configuration of a variable resistance memory device according to another embodiment.

FIG. 3 is a cross-sectional view illustrating a configuration of a variable resistance memory device 101 according to another embodiment.

The variable resistance memory device 101 of the present embodiment is different from the variable resistance memory device 100 of FIG. 1 in an order in which the first layer 11 and the second layer 12 constituting the variable resistance layer 120 are located. The first layer 11 formed of a material having a low density may be located over the second layer 12 formed of a material having a high density, and the first conductive element E1 and the second conductive element E2 may be located to contact both ends of the first layer 11.

Figure 4:
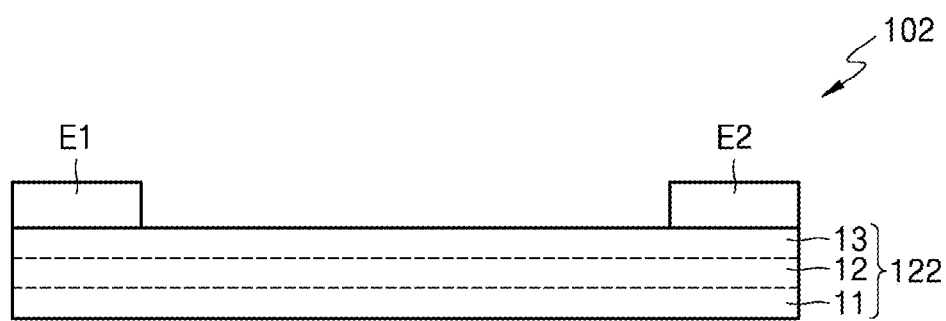
FIG. 4 is a cross-sectional view illustrating a configuration of a variable resistance memory device according to another embodiment.
Figure 5:
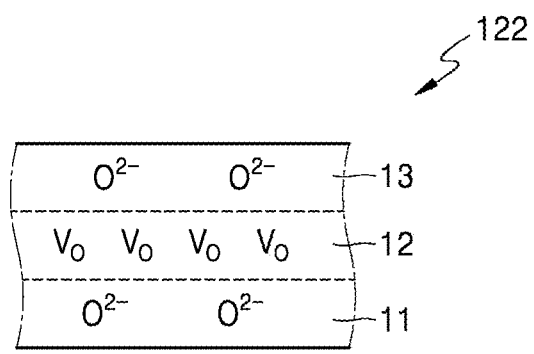
FIG. 5 is a conceptual view for describing the principle of resistance variation occurring in a variable resistance layer provided in the variable resistance memory device of FIG. 4.

FIG. 4 is a cross-sectional view illustrating a configuration of a variable resistance memory device according to another embodiment. FIG. 5 is a conceptual view for describing the principle of resistance variation occurring in a variable resistance layer provided in the variable resistance memory device of FIG. 4.

Referring to FIG. 4, a variable resistance memory device 102 includes a variable resistance layer 122 including the first layer 11, the second layer 12, and a third layer 13. The second layer 12 is an intermediate layer of the variable resistance layer 122 and may have a density higher than that of the first layer 11 and the third layer 13. The first layer 11 and the third layer 13 may be formed of the same material having a density lower than that of the second layer 12. However, the present disclosure is not limited thereto, and the first layer 11 and the third layer 13 may be formed of different materials each having a density lower than that of the second layer 12. Each of the first layer 11 and the third layer 13 may include SiO$_2$, and the second layer 12 may include HfO$_2$. In addition, each of the first layer 11 and the third layer 13 may include a first material, the second layer 12 may include a second material, and a combination of the first material and the second material may be selected as shown in Table 2.

Each of the first layer 11, the second layer 12, and the third layer 13 may have a thickness equal to or less than 10 nm. The second layer 12 may have a smallest thickness. For example, the second layer 12 may have a thickness equal to or less than 2 nm.

In the present embodiment, because the second layer 12 formed of a material having a high density is located in the middle and the first layer 11 and the third layer 13 each formed of a material having a low density are located adjacent to both surfaces of the second layer 12, a space where oxygen ions (O$^{2-}$) are to be diffused is more widened.

As shown in FIG. 5, when oxygen vacancies (V$_o$) and interstitial oxygen ions (O$^{2-}$) are formed in the variable resistance layer 122 due to an applied voltage, the oxygen ions (O$^{2-}$) may be rapidly diffused from the second layer 12 to the first layer 11 or the third layer 13 having a low density and a wide space between atoms. Accordingly, a conductive filament may be more easily formed due to the oxygen vacancies (V$_o$) in the second layer 12. Such diffusion may more smoothly occur, for example, than in a structure of FIG. 1 or 3, and a conductive filament may be more easily formed.

Figure 6:
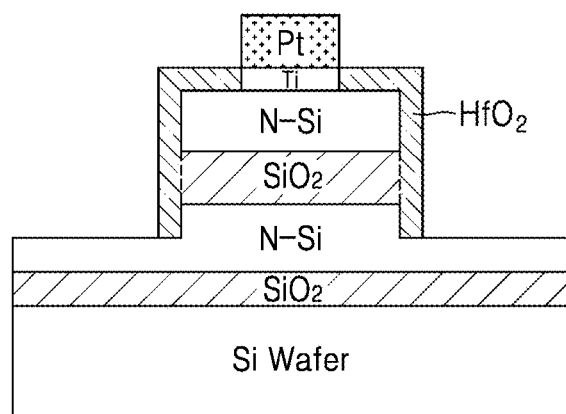
FIGS. 6 and 7 are cross-sectional views illustrating a configuration of a sample manufactured to test variable resistance performance of a structure in which variable resistance materials having a density difference are stacked adjacent to each other.
Figure 7:
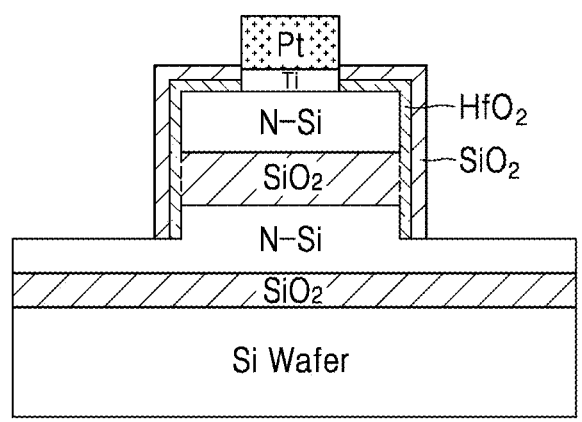

FIGS. 6 and 7 are cross-sectional views illustrating a configuration of a sample manufactured to test variable resistance performance of a structure in which variable resistance materials having a density difference are stacked adjacent to each other.

As shown in FIG. 6, an SiO$_2$ layer having a thickness of 100 nm, an N-type Si layer having a thickness of 400 nm, an SiO$_2$ layer having a thickness of 10 nm, and an N-type Si layer having a thickness of 50 nm were sequentially deposited on an Si wafer, then patterning and etching processes were performed to form a cylindrical device of N—Si(50 nm)/SiO$_2$(10 nm)/N—Si(50 nm). When HfO$_2$ that is a resistive switching material is deposited to 10 nm on a side surface of the cylindrical device and a voltage is applied between n-Si that is an upper electrode and N—Si that is a lower electrode, current flows from the upper electrode N—Si to the lower electrode N—Si along the HfO$_2$/SiO$_2$ layers. In this case, in order to improve contact resistance between a probe station terminal and the upper electrode N—Si, Ti(10 nm)/Pt(40 nm) was deposited on the upper electrode N—Si.

FIG. 7 illustrates a structure in which the HfO$_2$ layer has a thickness of 2 nm and an SiO$_2$ layer having a thickness 5 nm is additionally deposited on the HfO$_2$ layer, when compared to a structure of FIG. 6. When a voltage is applied between the upper electrode N—Si and the lower electrode N—Si, current flows from the upper electrode N—Si to the lower electrode N—Si along the SiO$_2$/HfO$_2$/SiO$_2$ layers.

The structures of FIGS. 6 and 7 are respectively examples for simulating the performance of the variable resistance layer 120 having a two-layer structure and the variable resistance layer 122 having a three-layer structure of FIGS. 1 and 4.

In the two structures, a set voltage $V_{set}$ for changing from a high-resistance state to a low-resistance state was measured, and an average set voltage $V_{set}$ of 35 samples as shown in FIG. 6 was 12.36 V and an average set voltage $V_{set}$ of 58 samples as shown in FIG. 7 was 11.17 V.

It is found that, when the set voltages $V_{set}$ are compared with set voltages $V_{set}$ of 15 V or more in an existing variable resistance device using a charge trap layer, a structure in which two layers having different densities are located adjacent to each other may reduce a set voltage. Also, it is found that, when a variable resistance layer is formed to have a three-layer structure in which a layer having a lowest density is located in the middle, a set voltage may be further reduced.

Figure 8:
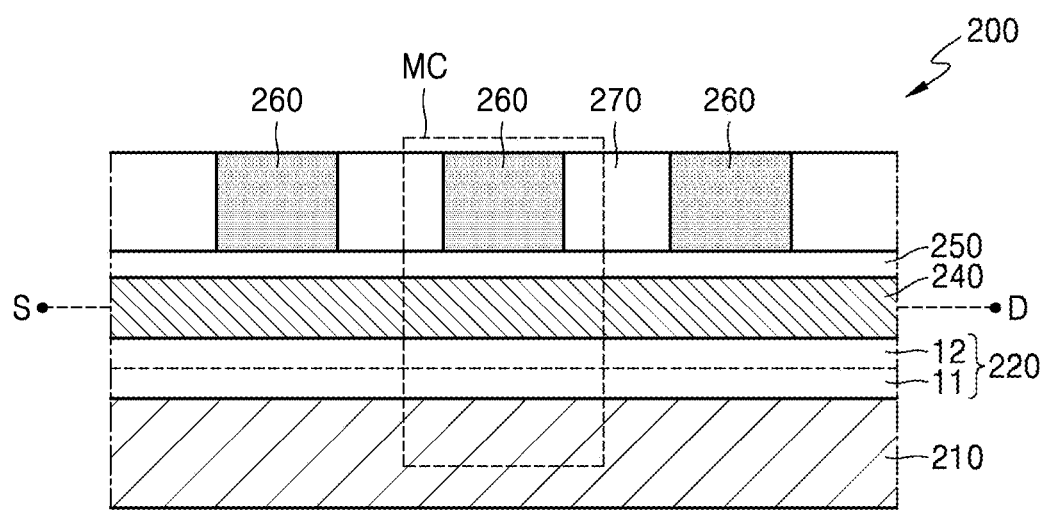
FIG. 8 is a cross-sectional view illustrating a configuration of a variable resistance memory device according to another embodiment.
Figure 9:
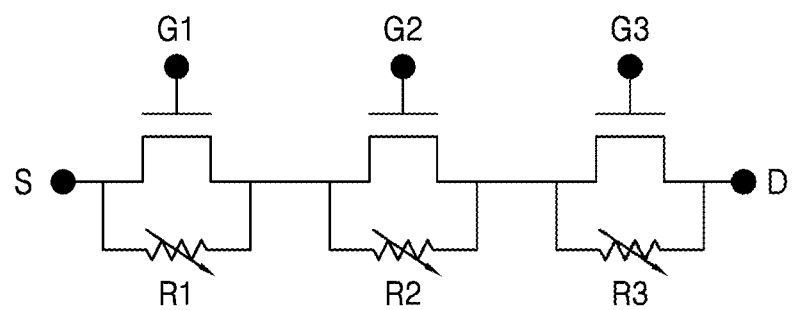
FIG. 9 is an equivalent circuit diagram of the variable resistance memory device of FIG. 8.

FIG. 8 is a cross-sectional view illustrating a configuration of a variable resistance memory device according to another embodiment. FIG. 9 is an equivalent circuit diagram of the variable resistance memory device of FIG. 8.

Referring to FIG. 8, a variable resistance memory device 200 includes an insulating layer 210, a variable resistance layer 220 located on the insulating layer 210, a channel layer 240 located on the variable resistance layer 220, a gate insulating layer 250 located on the channel layer 240, and a plurality of gate electrodes 260 formed on the gate insulating layer 250. A space between the plurality of gate electrodes 260 may be filled with an insulating layer 270. However, this is merely an example, and the insulating layer 270 may be omitted.

The variable resistance layer 220 includes the first layer 11 formed of a first material and the second layer 12 formed of a second material having a density different from that of the first material. The second layer 12 may have a density higher than that of the first layer 11. A material and characteristics of the variable resistance layer 220 are substantially the same as those of the variable resistance layer 120 of FIG. 1. That is, the variable resistance layer 220 is formed to have a multi-layer structure in which the first layer 11 having a low density and the second layer 12 having a high density are adjacent to each other, oxygen ions may be smoothly diffused to oxides having a wide space between atoms and a low density, and a conductive filament may be easily formed due to oxygen vacancies ($V_o$).

Although the second layer 12 having a high density is located over the first layer 11 having a low density in the variable resistance layer 220, the present disclosure is not limited thereto and an order in which the first layer 11 and the second layer 12 are stacked may be changed. That is, the first layer 11 having a low density may be formed on the second layer 12 having a high density, so that the first layer 11 may contact the channel layer 240.

The channel layer 240 may be formed of a semiconductor material. The channel layer 240 may be formed of, for example, polycrystalline silicon (poly-Si). A source electrode S and a drain electrode D may be connected to both ends of the channel layer 240.

The gate insulating layer 250 may be formed of any of various insulating materials. For example, silicon oxide, silicon nitride, or silicon oxynitride may be used for the gate insulating layer 250.

A voltage for turning on/off the channel layer 240 may be selectively applied to each of the plurality of gate electrodes 260.

The variable resistance memory device 200 has a structure in which a plurality of memory cells MC are arrayed, and each of the memory cells MC includes a transistor and a variable resistor that are connected in parallel as shown in the equivalent circuit diagram of FIG. 9. A resistance value of each variable resistor is set by a voltage applied to a gate electrode and a voltage between the source electrode S and the drain electrode D, and corresponds to information of 1 or 0.

An operation of the variable resistance memory device 200 will now be described with reference to FIG. 10.

When a memory cell to be written is selected, a gate voltage value of the selected cell is adjusted so that a channel is not formed in the selected cell, that is, the selected cell is in a channel-off state, and gate voltage values of unselected cells are adjusted so that the unselected cells are in a channel-on state.

Figure 10:
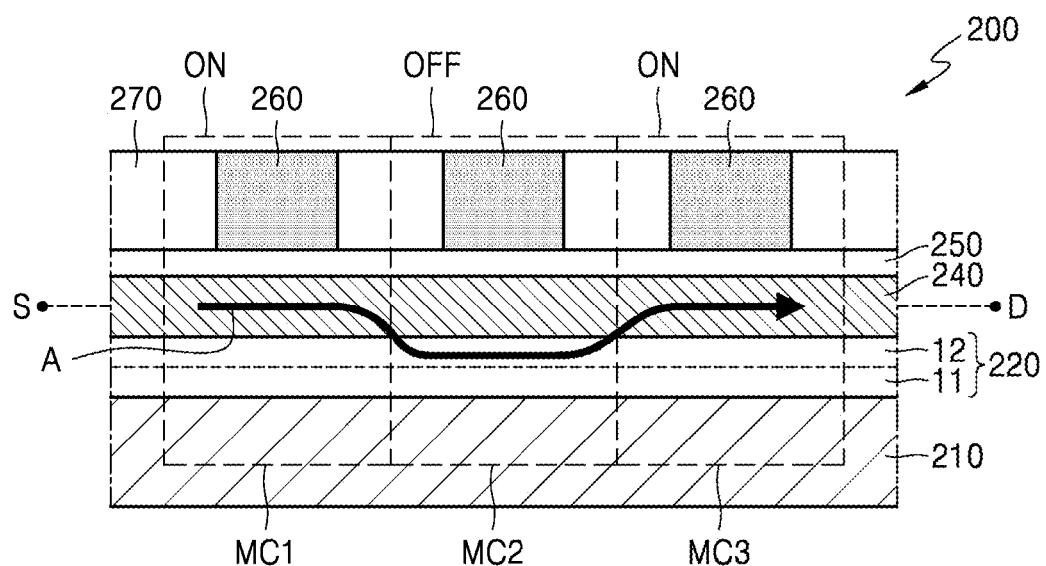
FIG. 10 is a conceptual view for describing an operation of the variable resistance memory device of FIG. 8.

FIG. 10 illustrates that a gate voltage is applied to the gate electrode 260 of each cell so that a memory cell MC2 in the middle is turned off, and two memory cells MC1 and MC2 on both sides are turned on. When a voltage is applied between the source electrode S and the drain electrode D, a conduction path is formed as marked by an arrow A. When an applied voltage is $V_{set}$ or $V_{reset}$, desired information of 1 or 0 may be written to the memory cell MC2 that is a selected memory cell.

Also a read operation may be performed on a selected cell in a similar manner. That is, after a gate voltage applied to each gate electrode 260 is adjusted so that the selected memory cell MC2 is in a channel-off state and unselected memory cells MC1 and MC2 are in a channel-on state, a cell state (1 or 0) may be checked by measuring current flowing through the memory cell MC2 due to a voltage $V_{read}$ applied between the source electrode S and the drain electrode D.

Figure 11:
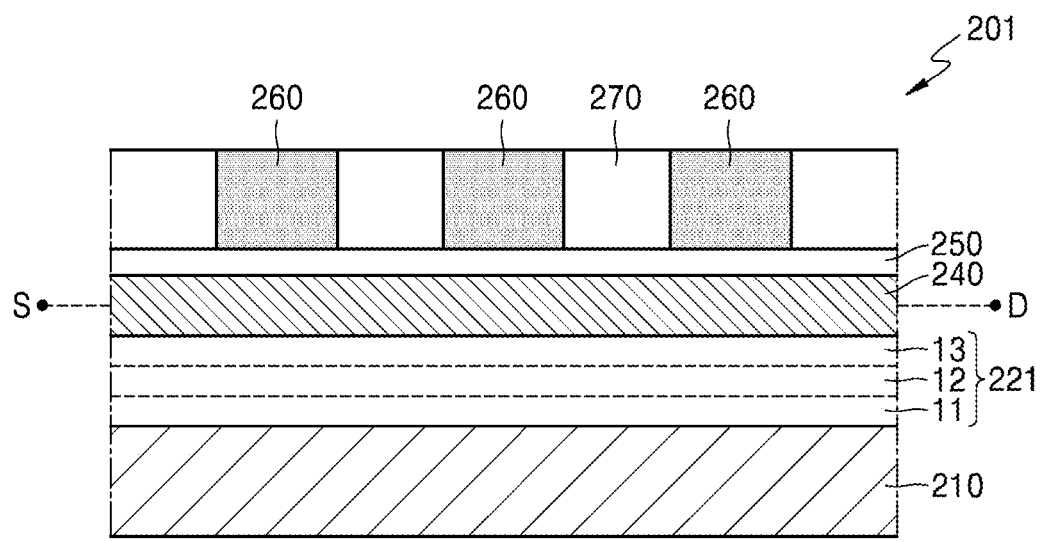
FIG. 11 is a cross-sectional view illustrating a structure of a variable resistance memory device according to another embodiment.

FIG. 11 is a cross-sectional view illustrating a structure of a variable resistance memory device according to another embodiment.

A variable resistance memory device 201 of the present embodiment is substantially the same as the variable resistance memory device 200 of FIG. 8 except that a variable resistance layer 221 includes the first layer 11, the second layer 12, and the third layer 13.

The variable resistance layer 221 includes the first layer 11, the second layer 12, and the third layer 13. The second layer 12 that is an intermediate layer of the variable resistance layer 221 may have a density higher than that of the first layer 11 and the third layer 13. The first layer 11 and the third layer 13 may be formed of the same material having a density lower than that of the second layer 12. However, the present disclosure is not limited thereto, and the first layer 11 and the third layer 13 may be formed of different materials.

Because the variable resistance memory device 201 of the present embodiment includes the variable resistance layer 221 in which the second layer 12 formed of a material having a high density is located in the middle and the first layer 11 and the third layer 13 each formed of a material having a low density are located adjacent to both surfaces of the second layer 12, oxygen ions may be more easily diffused to a layer having a wide space between atoms and a low density and a conductive filament may be more smoothly formed due to oxygen vacancies. The variable resistance memory device 201 of an embodiment may have a low set voltage, and for example, may have a set voltage lower than that of the variable resistance memory device 200 of FIG. 8.

Figure 12:
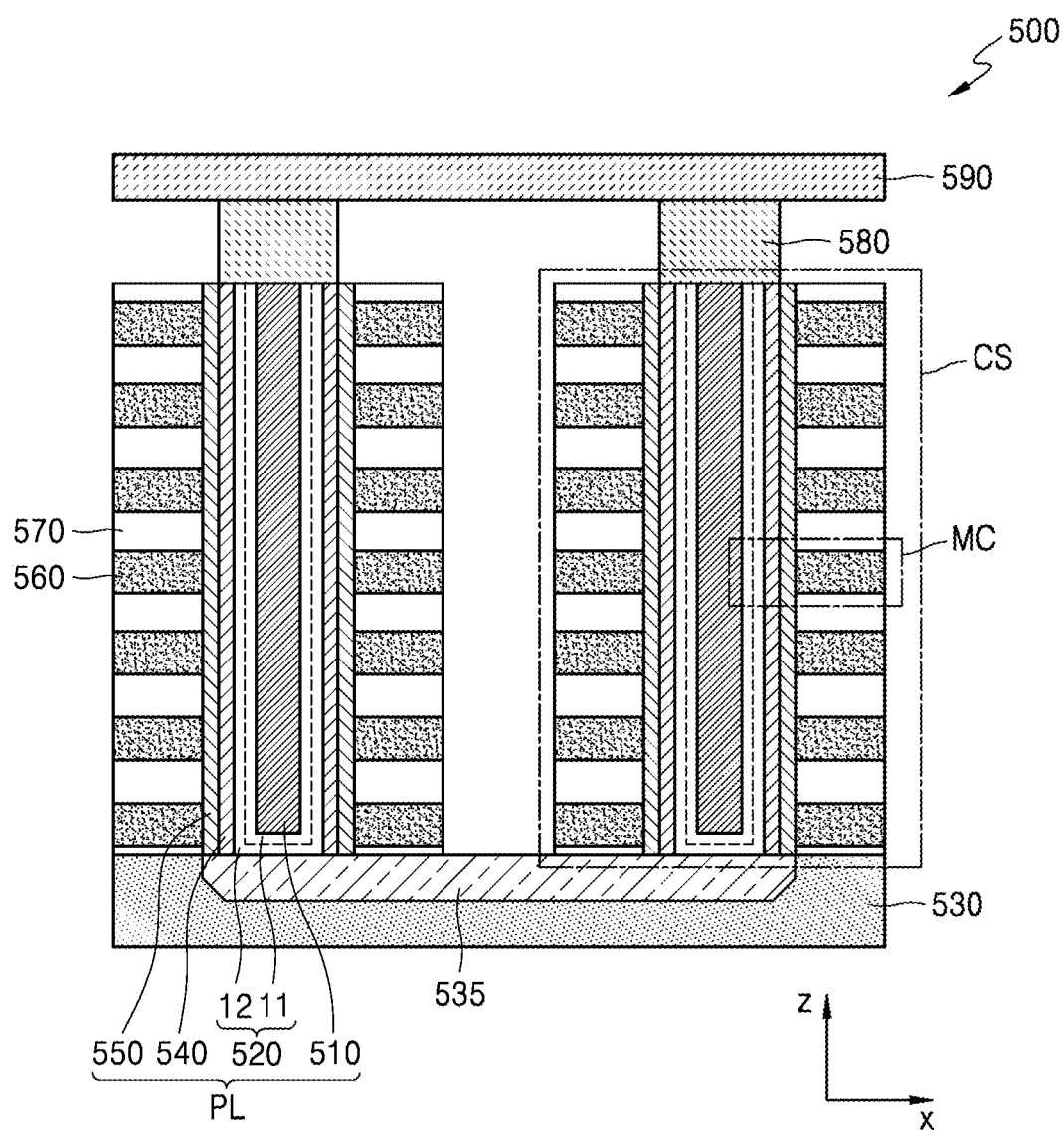
FIG. 12 is a cross-sectional view illustrating a structure of a variable resistance memory device according to another embodiment.
Figure 13:
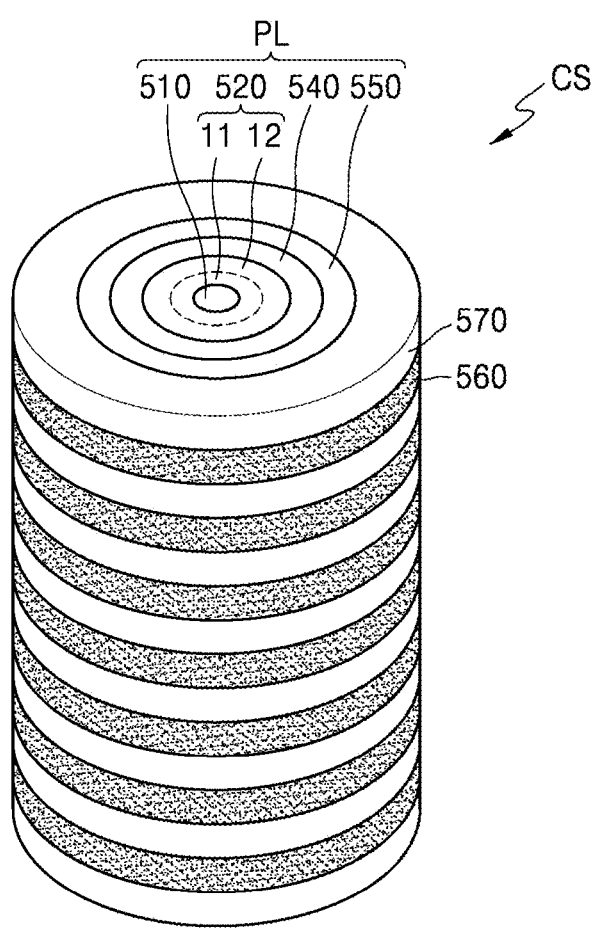
FIG. 13 is a perspective view illustrating a structure of a memory string provided in the variable resistance memory device of FIG. 12.
Figure 14:
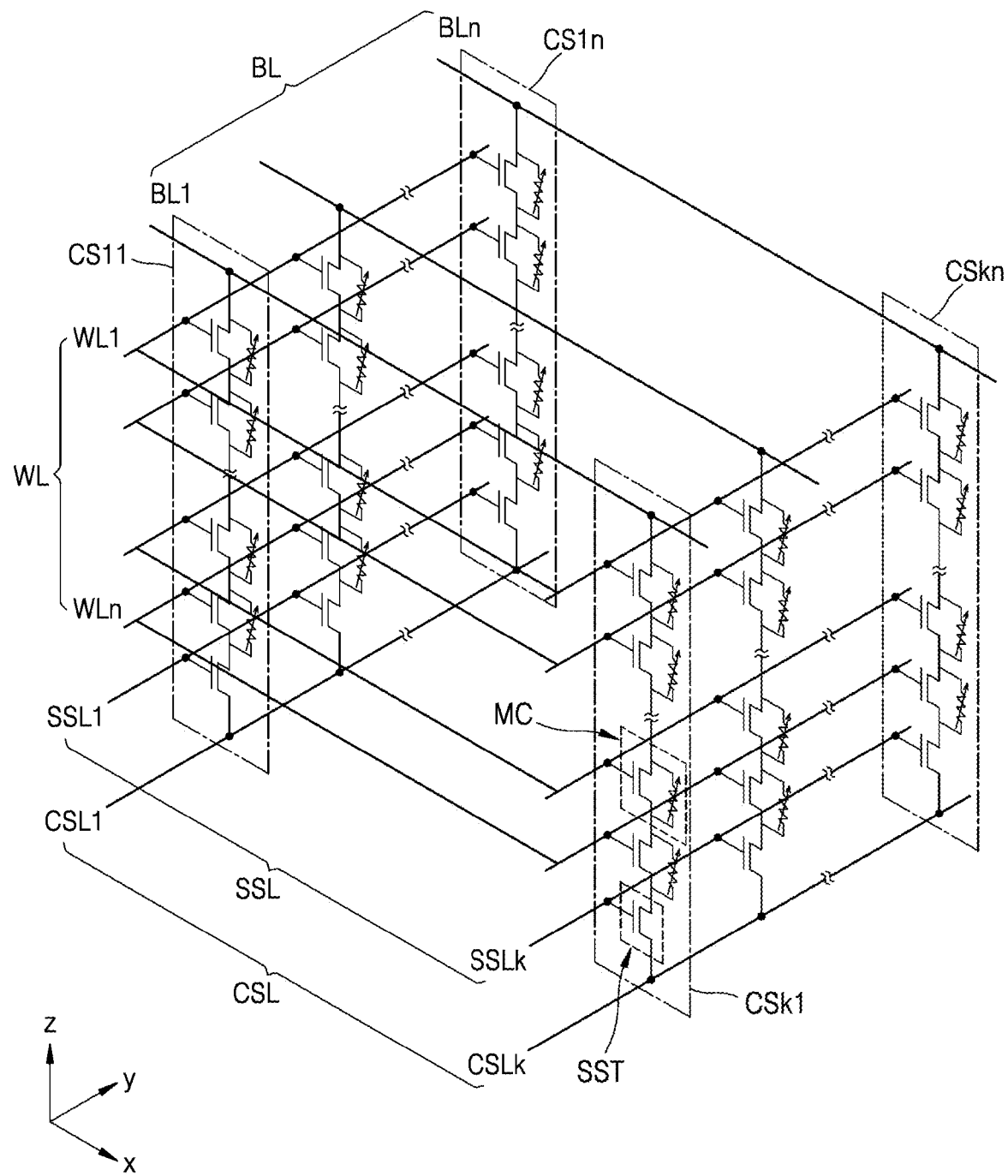
FIG. 14 is an equivalent circuit diagram of the variable resistance memory device of FIG. 12.

FIG. 12 is a cross-sectional view illustrating a structure of a variable resistance memory device according to another embodiment. FIG. 13 is a perspective view illustrating a structure of a memory string provided in the variable resistance memory device of FIG. 12. FIG. 14 is an equivalent circuit diagram of the variable resistance memory device of FIG. 12.

A variable resistance memory device 500 of the present embodiment is a vertical NAND (VNAND) memory in which a plurality of memory cells MC including a variable resistance material are vertically arrayed.

Referring to FIGS. 12 through 14, a detailed configuration of the variable resistance memory device 500 will now be described.

First, referring to FIG. 12, a plurality of cell strings CS are formed on a substrate 530.

The substrate 530 may include a silicon material doped with a first type impurity. For example, the substrate 530 may include a silicon material doped with a p-type impurity. For example, the substrate 530 may be a p-type well (e.g., a pocket p-well). The following will be described assuming that the substrate 530 is a p-type silicon substrate. However, the substrate 530 is not limited to the p-type silicon substrate.

A doping region 535 is provided on the substrate 570. For example, the doping region 535 may be of a second type different from that of the substrate 535. For example, the doping region 535 may be an n-type region. The following will be described assuming that the doping region 535 is an n-type region. However, the doping region 535 is not limited to the n-type region. The doping region 535 may be connected to a common source line CSL.

k*n cell strings CS may be arranged in a matrix as shown in the equivalent circuit diagram of FIG. 14, and each may be denoted by CSij (1≤i≤k and 1≤j≤n) according to each row and column position. Each cell string CSij is connected to a bit line BL, a string selection line SSL, a word line WL, and the common source line CSL.

Each cell string CSij includes memory cells MC and a string selection transistor SST. The memory cells MC and the string selection transistor SST of each cell string CSij may be stacked in a height direction.

Rows of a plurality of cell strings CS are respectively connected to different string selection lines SSL1 through SSLk. For example, string selection transistors SST of cell strings CS11 through CS1n are commonly connected to the string selection line SSL1. String selection transistors SST of the cell strings CSk1 through CSkn are commonly connected to the string selection line SSLk.

Columns of a plurality of cell strings CS are respectively connected to different bit lines BL1 through BLn. For example, memory cells MC and string selection transistors SST of the cell strings CS11 through CSk1 may be commonly connected to the bit line BL1, and memory cells MC and string selection transistors SST of the cell strings CS1n through CSkn may be commonly connected to the bit line BLn.

The rows of the plurality of cell strings CS may be respectively connected to different common source lines CSL1 through CSLk. For example, the string selection transistors SST of the cell strings CS11 through CS1n may be commonly connected to the common source line CSL1, and the string selection transistors SST of the cell strings CSk1 through CSkn may be commonly connected to the common source line CSLk.

Memory cells MC located at the same height from the substrate 530 or the string selection transistors SST may be commonly connected to one word line WL, and memory cells MC located at different heights may be respectively connected to different word lines WL1 through WLm.

A circuit structure illustrated in FIG. 14 is merely an example. For example, the number of rows of the cell strings CS may be increased or reduced. As the number of rows of cell strings Cs is changed, the number of string selection lines connected to the rows of cell strings CS and the number of cell strings CS connected to one bit line may also be changed. As the number of rows of cell strings CS is changed, the number of common source lines connected to the rows of cell strings CS may also be changed.

The number of columns of cell strings CS may also be increased or reduced. As the number of columns of cell strings CS is changed, the number of bit lines connected to the columns of cell strings CS and the number of the cell strings CS connected to one string selection line may also be changed.

A height of the cell string CS may also be increased or reduced. For example, the number of memory cells MC stacked in each of the cell strings CS may be increased or reduced. As the number the memory cells MC stacked in each cell string CS is changed, the number of word lines WL may also be changed. For example, string selection transistors respectively provided to the cell strings CS may be increased. As the number of string selection transistors provided to the cell strings CS is changed, the number of string selection lines or common source lines may also be changed. When the number of string selection transistors is increased, the string selection transistors may be stacked in the same manner as that of the memory cells MC.

For example, write and read operations may be performed in units of rows of the cell strings CS. The cell strings CS may be selected by the common source line CSL in units of one row, and the cell strings CS may be selected by the string selection lines SSL in units of one row. Also, a voltage may be applied to the common source lines CSL in units of at least two common source lines CSL. A voltage may be applied to the common source lines CSL in units of total common source lines CSL.

In a selected row of the cell strings CS, write and read operations may be performed in units of pages. A page may be one row of memory cells connected to one word line WL. In a selected row of the cell strings CS, memory cells may be selected by the word lines WL in units of pages.

One cell string CS includes a cylindrical pillar PL and a plurality of gate electrodes 560 and a plurality of insulators 570 surrounding the cylindrical pillar PL in a ring shape, as shown in FIG. 13. The plurality of gate electrodes 560 and the plurality of insulators 570 may be alternately stacked in a vertical direction (e.g., a Z-direction).

The gate electrodes 560 may be formed of a metal material or a heavily doped silicon material. Each gate electrode 560 is connected to one of the word line WL and the string selection line SSL.

The insulator 570 may be formed of any of various insulating materials such as silicon oxide or silicon nitride.

The pillar PL may include a plurality of layers. An outermost layer of the pillar PL may be a gate insulating layer 550. For example, the gate insulating layer 550 may be formed of any of various insulating materials such as silicon oxide, silicon nitride, or silicon oxynitride. The gate insulating layer 550 may be conformally deposited on the pillar PL.

A channel layer 540 may be conformally deposited along an inner surface of the gate insulating layer 550. The channel layer 540 may include a semiconductor material doped with a first type dopant. The channel layer 540 may include a silicon material that is doped with the same type of dopant as that of the substrate 530, and when the substrate 530 includes a silicon material that is doped with a p-type dopant, the channel layer 540 may include a silicon material that is also doped with a p-type dopant. Alternatively, the channel layer 540 may include a material such as germanium (Ge), IGZO, or GaAs.

A variable resistance layer 520 may be located along an inner surface of the channel layer 540. The variable resistance layer 520 may be contact the channel layer 540 and may be conformally deposited on the channel layer 540.

The variable resistance layer 520 that changes to a high-resistance state or a low-resistance state according to an applied voltage may include the first layer 11 and the second layer 12 formed of oxides having different densities. The variable resistance layer 520 may be substantially the same as the variable resistance layer 120 of FIG. 1.

Each of the first layer 11 and the second layer 12 of the variable resistance layer 520 may include an oxide of at least one element selected from the group consisting of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr), and silicon (Si). An oxide having a bandgap energy of 2 eV or more may be used for each of the first material 11 and the second material 12, and for example, any one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, and $BeO$ may be used. That is, the first layer 11 may be formed of a material having a low density, and the second layer 12 may be formed by selecting a material having a relatively high density. Accordingly, because oxygen ions may be smoothly diffused and a conductive filament may be easily formed due to oxygen vacancies, the variable resistance memory device 500 may have low set voltage and reset voltage characteristics.

The channel layer 540 and the variable resistance layer 520 may contact the doping region 535), that is, a common source region.

A drain 580 may be provided on the pillar PL. The drain 580 may include a silicon material that is doped with a second type dopant. For example, the drain 580 may include a silicon material that is doped with an n-type dopant.

A bit line 590 may be provided on the drain 580. The drain 580 and the bit line 590 may be connected through contact plugs.

Each gate electrode 560 and portions of the gate insulating layer 550, the channel layer 540, and the variable resistance layer 520 facing the gate electrode 560 in a horizontal direction (e.g., an X-direction) constitute the memory cell MC. That is, the memory cell MC has a circuit structure in which a transistor including the gate electrode 560, the gate insulating layer 550, and the channel layer 540 and a variable resistor of the variable resistance layer 520 are connected in parallel.

Such parallel connection structures are continuously arranged in the vertical direction (e.g., the Z-direction) to form the cell string CS. Both ends of the cell string CS may be connected to the common source line CSL and the bit line BL, as shown in the equivalent circuit diagram of FIG. 14. Program, read, and erase operations may be performed on the plurality of memory cells MC by applying a voltage to the common source line CSL and the bit line BL.

For example, when one memory cell MC to be written is selected, a gate voltage value of the selected cell is adjusted so that a channel is not formed in the selected cell, that is, the selected cell is in a channel-off state, and gate voltage values of unselected cells are adjusted so that the unselected cells are in a channel-on state. Accordingly, a current path formed due to a voltage applied to the common source line CSL and the bit line BL may pass through the variable resistance layer 520 of the selected memory cell MC, and when an applied voltage is $V_{set}$ or $V_{reset}$, a low-resistance state or a high-resistance state may be obtained and desired information of 1 or 0 may be written to the selected memory cell MC.

Also a read operation may be performed on the selected cell in a similar manner. That is, after a gate voltage applied to each gate electrode 560 is adjusted so that the selected memory cell MC is in a channel-off state and unselected memory cells are in a channel-on state, a cell state (1 or 0) may be checked by measuring current flowing through the memory cell MC due to a voltage $V_{read}$ applied between the common source line CSL and the bit line BL.

Figure 15:
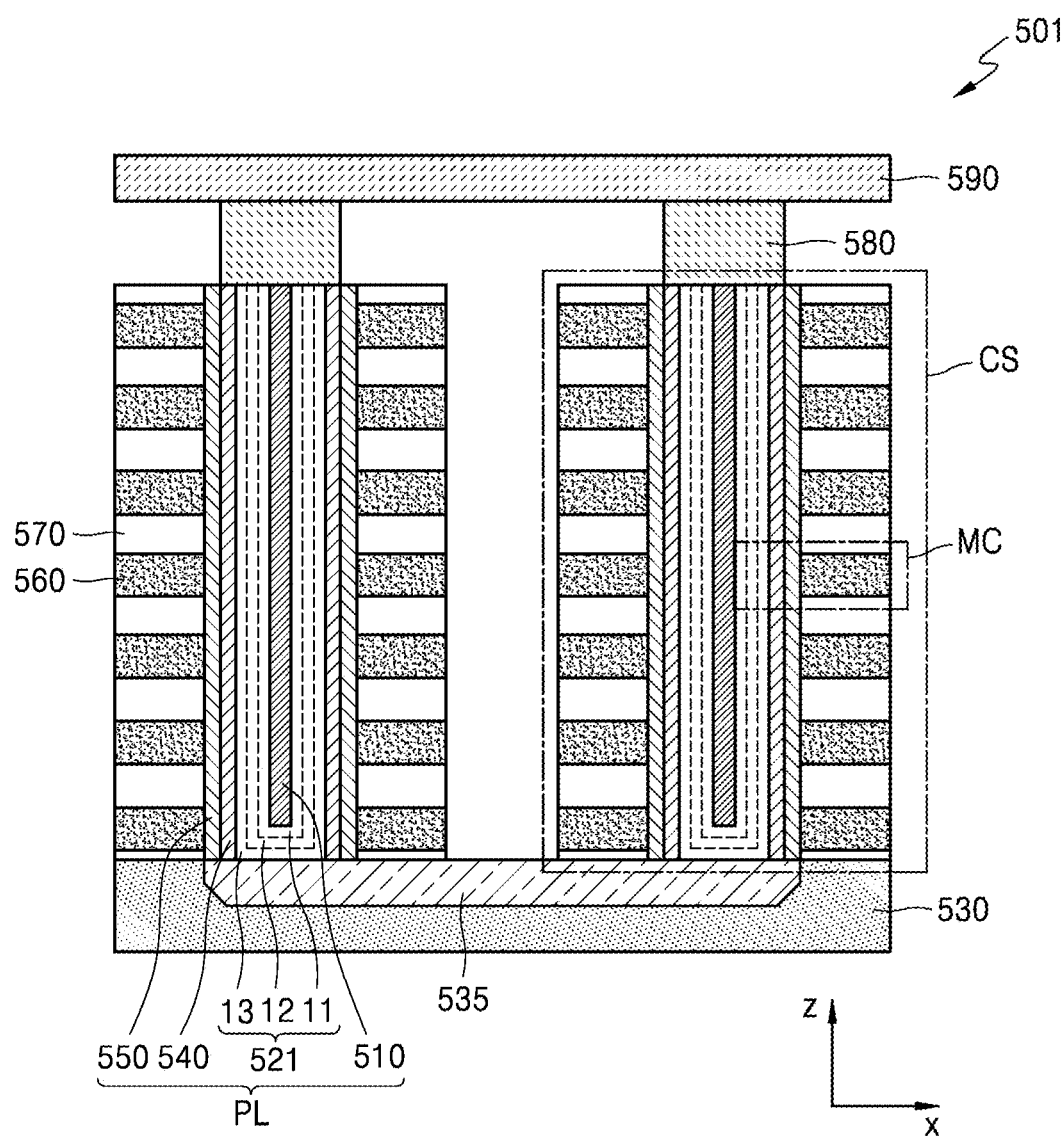
FIG. 15 is a cross-sectional view illustrating a structure of a variable resistance memory device according to another embodiment.

FIG. 15 is a cross-sectional view illustrating a structure of a variable resistance memory device according to another embodiment.

Figure 16:
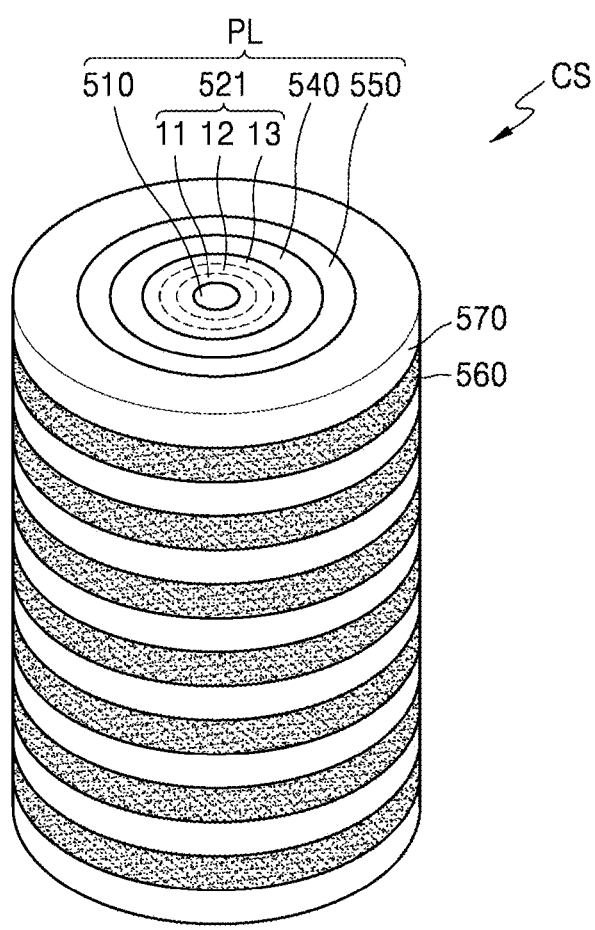
FIG. 16 is a perspective view illustrating a structure of a memory string provided in the variable resistance memory device of FIG. 15.

A variable resistance memory device 501 of the present embodiment is substantially the same as the variable resistance memory device 500 of FIG. 12 except that a variable resistance layer 521 includes the first layer 11, the second layer 12, and the third layer 13 having different densities. One cell string CS includes a cylindrical pillar PL and a plurality of gate electrodes 560 and a plurality of insulators 570 surrounding the cylindrical pillar PL in a ring shape, as shown in FIG. 16. The plurality of gate electrodes 560 and the plurality of insulators 570 may be alternately stacked in a vertical direction (e.g., a Z-direction).

The second layer 12 may have a density higher than that of the first layer 11 and the third layer 13. The first layer 11 and the third layer 13 may be formed of the same material having a density lower than that of the second layer 12. However, the present disclosure is not limited thereto, and the first layer 11 and the third layer 13 may be formed of different materials each having a density lower than that of the second layer 12. Each of the first layer 11 and the third layer 13 may include $SiO_2$, and the second layer 12 may include $HfO_2$. In addition, each of the first layer 11 and the third layer 13 may include a first material, and the third layer 12 may include a second material, and a combination of the first material and the second material may be selected as shown in Table 2. Each of the first layer 11, the second layer 12, and the third layer 13 may have a thickness equal to or less than 10 nm. The second layer 12 may have a smallest thickness. For example, the second layer 12 may have a thickness equal to or less than 2 nm. Also, the third layer 13 contacting the channel layer 540 may have a thickness equal to or greater than 5 nm.

In the present embodiment, because the second layer 12 formed of a material having a high density is located in the middle and the first layer 11 and the third layer 13 each formed of a material having a low density are located adjacent to both surfaces of the second layer 12, a space where oxygen ions ($O^{2-}$) are to be diffused may be more widened and a conductive filament due to oxygen vacancies may be more easily formed. The variable resistance memory device 501 may have a set voltage lower than that of FIG. 12.

Although a variable resistance layer includes two or three layers in the above embodiments, the present disclosure is not limited thereto and the variable resistance layer may include three or more layers in which layers having a desired and/or alternative predetermined density difference are located adjacent to one another.

As described above, because the variable resistance memory devices 500 and 501 according to the embodiments may be implemented by arraying the memory cells MC including the variable resistance layers 520 and 521 having a structure in which a conductive filament is easily formed due to oxygen vacancies, the variable resistance layers 520 and 521 may be thinner and lower operating voltages may be achieved than those of memory devices having existing structures, for example, phase change material or charge trap-based memory devices. Because the variable resistance memory devices 500 and 501 may solve a scaling issue between memory cells in a next-generation VNAND, a integration density may be increased and low power consumption may be achieved.

The variable resistance memory devices 500 and 501 according to the present disclosure may include chip-type memory blocks, and may be used in a memory system, may be used as a neuromorphic computing platform or may be used to form a neural network.

Figure 17:
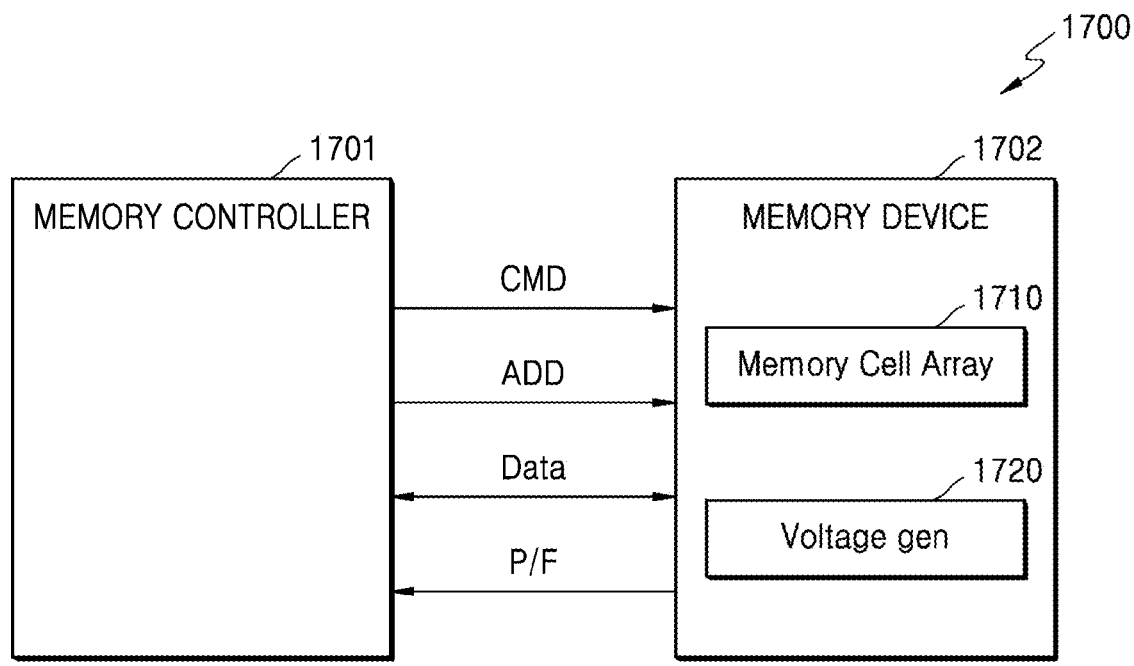
FIG. 17 is a block diagram of a memory system according to an embodiment.

FIG. 17 is a block diagram of a memory system according to an embodiment.

Referring to FIG. 17, the memory system 1700 may include a memory controller 1701 and a memory device 1702. The memory controller 1701 performs a control operation with respect to the memory device 1702, for example, the memory controller 1701 provides the memory device 1702 with an address ADD and a command CMD to perform a programming (or writing), a reading, and/or an erasing operation with respect to the memory device 1702. Also, data for the programming operation and read data may be transmitted between the memory controller 1701 and the memory device 1702.

The memory device 1702 may include a memory cell array 1710 and a voltage generator 1720. The memory cell array 1710 may include a plurality of memory cells that are arranged on regions where a plurality of word lines and a plurality of bit lines intersect with each other. The memory cell array 1710 includes non-volatile memory cells based on the embodiments in FIGS. 1-5 and 8-16 of the present application.

The memory controller 1701 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The memory controller 1701 may operate in response to requests from a host (not shown) and may be configured to access the memory device 1702 and control operations discussed above (for example for the write/read operations in FIG. 10), thereby transforming the memory controller 1701 into a special purpose controller. The memory controller 1701 may generate an address ADD and a command CMD for performing programming/reading/erasing operations on the memory cell array 1710. Also, in response to commands from the memory controller 1701, the voltage generator 1720 (e.g., power circuit) may generate a voltage control signal for controlling at least one voltage level used in the non-volatile memory device 1702. As an example, the voltage generator 1720 may generate the voltage control signal for controlling a voltage level of a word line for reading data from or programming data on the memory cell array 1710.

In addition, memory controller 1701 may perform a determination operation on the data read from the non-volatile memory device 1702. For example, by determining the data read from the memory cells, the number of on-cells and/or off-cells from among the memory cells may be determined. The memory device 1702 may provide the memory controller 1701 a pass/fail signal P/F according to a read result with respect to the read data. The memory controller 1701 may refer to the pass/fail signal P/F and thus control write and read operations of the memory cell array 1710.

Figure 18:
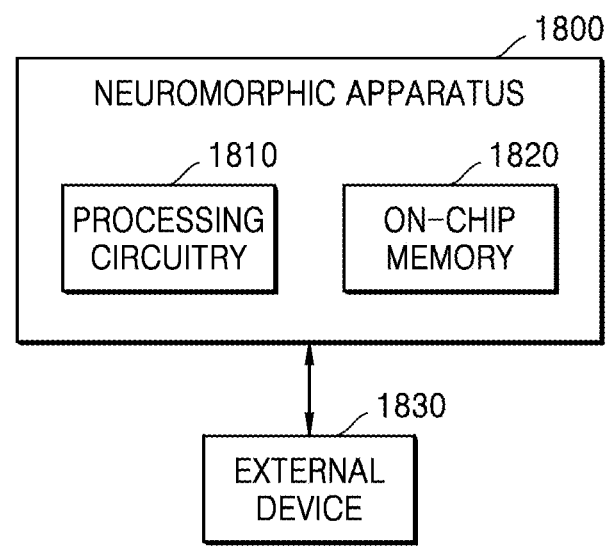
FIG. 18 is a diagram illustrating a neuromorphic apparatus and an external device connected thereto according to an embodiment.

FIG. 18 is a diagram illustrating a neuromorphic apparatus and an external device connected thereto according to an embodiment.

Referring to FIG. 18 a neuromorphic apparatus 1800 may include processing circuitry 1810 and/or memory 1820. The neuromorphic apparatus 1800 may include a memory based on the embodiments in FIGS. 1-5 and 8-16 of the present application.

In some example embodiments, processing circuitry 1810 may be configured to control functions for driving the neuromorphic apparatus 1800. For example, the processing circuitry 1810 may be configured to control the neuromorphic apparatus 1800 by executing programs stored in the memory 1820 of the neuromorphic apparatus 1800. In some example embodiments, the processing circuitry may include hardware such as logic circuits; a hardware/software combination, such as a processor executing software; or a combination thereof. For example, a processor may include, but is not limited to, a central processing unit (CPU), a graphics processing unit (GPU), an application processor (AP) included in the neuromorphic apparatus 1800, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), or the like. In some example embodiments, the processing circuitry 1810 may be configured to read/write various data from/in the external device 1830 and/or execute the neuromorphic apparatus 1800 by using the read/written data. In some embodiments, the external device 1830 may include an external memory and/or sensor array with an image sensor (e.g., CMOS image sensor circuit).

In some embodiments, the neuromorphic apparatus in FIG. 18 may be applied in a machine learning system. The machine learning system may utilize a variety of artificial neural network organizational and processing models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by electronic devices.

Although the variable resistance memory device has been described with reference to the embodiments, this is merely an example, and it will be understood by one of ordinary skill in the art that various modifications and equivalent embodiments may be made therefrom. Although the present disclosure is described with reference to some embodiments, the embodiments are merely examples and do not limit the scope of the present disclosure. The scope of the present disclosure is not limited by the described embodiments but is limited only by the claims.

The variable resistance memory device may have resistive switching at a low applied voltage.

The variable resistance memory device may have a wide variable resistance range.

The variable resistance memory device may easily have low power consumption and high integration density.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A variable resistance memory device comprising:
   a variable resistance layer including a first layer, a second layer on the first layer, and a third layer on the second layer,
   the first layer formed of a first material,
   the second layer formed of a second material,
   the third layer formed of a third material; and
   a first conductive element and a second conductive element on the variable resistance layer and spaced apart from each other in order to form a current path in the variable resistance layer in a direction perpendicular to a direction in which the first layer and the second layer are stacked, wherein
   the second layer is between the first layer and the third layer,
   the third layer is between the second layer and each of the first conductive element and the second conductive element,
   a density of the second material is higher than a density of the first material,
   a density of the third material is lower than the density of the second material.

2. The variable resistance memory device of claim 1, the first material and the third material are a same one of $HfO_2$, $Gd_2O_3$, NiO, and $WO_3$, and
   the second material is one of $TiO_2$, $MnO_2$, $ZrO_2$, $SiO_2$, $Cr_2O_3$, $La_2O_3$, SrO, CaO, BeO, $MoO_3$,
   provided that the first material and the second material have a same valence.

3. The variable resistance memory device of claim 1, wherein a density difference between the first material and the second material is greater than 1 $g/cm^3$ and less than 8 $g/cm^3$.

4. The variable resistance memory device of claim 1, wherein a density difference between the second material and the third material is greater than 1 $g/cm^3$ and less than 8 $g/cm^3$.

5. The variable resistance memory device of claim 4, wherein the first material and the third material are a same material.

6. The variable resistance memory device of claim 4, wherein
   a thickness of the second layer is less than a thickness of the first layer, and
   the thickness of the second layer is less than a thickness of the third layer.

7. The variable resistance memory device of claim 1, wherein each of the first material and the second material is an oxide having a bandgap energy of 2 eV or more.

8. The variable resistance memory device of claim 1, wherein each of the first material and the second material independently is any one of $Rb_2O$, $TiO_2$, BaO, $ZrO_2$, CaO, $HfO_2$, SrO, $Sc_2O_3$, MgO, $Li_2O$, $Al_2O_3$, $SiO_2$, BeO, $Nb_2O_5$, NiO, $Ta_2O_5$, $WO_3$, $V_2O_5$, $La_2O_3$, $Gd_2O_3$, CuO, $MoO_3$, $Cr_2O_3$, and $MnO_2$.

9. The variable resistance memory device of claim 1, wherein
   the first material and the second material have a same valence, and
   a density difference between the first material and the second material is greater than 1.5 $g/cm^3$.

10. A variable resistance memory device comprising:
    an insulating layer;
    a variable resistance layer on the insulating layer, the variable resistance layer including a first layer, a second layer on the first layer, and a third layer on the second layer,
    the first layer formed of a first material, the second layer formed of a second material, the third layer formed of a third material;
    a channel layer on the variable resistance layer;
    a gate insulating layer on the channel layer; and
    a plurality of gate electrodes spaced apart from one another on the gate insulating layer, wherein
    the first conductive element and the second conductive element are two of the plurality of gate electrodes,
    the second layer is between the first layer and the third layer,
    the third layer is between the second layer and the plurality of gate electrodes,
    a density of the second material is higher than a density of the first material, and
    a density of the third material is lower than the density of the second material.

11. The variable resistance memory device of claim 10, wherein
    the first material and the third material are a same one of $HfO_2$, $Gd_2O_3$, NiO, and $WO_3$, and
    the second material is one of $TiO_2$, $MnO_2$, $ZrO_2$, $SiO_2$, $Cr_2O_3$, $La_2O_3$, SrO, CaO, BeO, $MoO_3$,
    provided that the first material and the second material have a same valence.

12. The variable resistance memory device of claim 10, wherein a density difference between the first material and the second material is greater than 1 $g/cm^3$ and less than 8 $g/cm^3$.

13. The variable resistance memory device of claim 10, wherein a thickness of each of the first layer, the second layer, and the third layer is equal to or less than 10 nm.

14. The variable resistance memory device of claim 13, wherein the second layer has a thickness equal to or less than 2 nm.

15. The variable resistance memory device of claim 13, wherein the third layer contacts the channel layer and has a thickness equal to or greater than 5 nm.

16. The variable resistance memory device of claim 10, wherein a density difference between the second material and the third material is greater than 1 g/cm$^3$ and less than 8 g/cm$^3$.

17. The variable resistance memory device of claim 10, wherein the first material and the third material are a same material.

18. The variable resistance memory device of claim 10, wherein each of the first material and the second material is an oxide having a bandgap energy of 2 eV or more.

19. The variable resistance memory device of claim 10, wherein each of the first material and the second material independently is any one of $Rb_2O$, $TiO_2$, BaO, $ZrO_2$, CaO, $HfO_2$, SrO, $Sc_2O_3$, MgO, $Li_2O$, $Al_2O_3$, $SiO_2$, BeO, $Nb_2O_5$, NiO, $Ta_2O_5$, $WO_3$, $V_2O_5$, $La_2O_3$, $Gd_2O_3$, CuO, $MoO_3$, $Cr_2O_3$, and $MnO_2$.

20. A variable resistance memory device comprising:
a variable resistance layer including a first layer and second layer,
the first layer formed of a first material,
the second layer on the first layer, the second layer formed of a second material, and
a density of the first material being higher than a density of the second material; and
a first conductive element and a second conductive element on the variable resistance layer and spaced apart from each other in order to form a current path in the variable resistance layer in a direction perpendicular to a direction in which the first layer and the second layer are stacked, wherein
the first material is $HfO_2$ and the second material is $MnO_2$, $ZrO_2$, $SiO_2$, or $Cr_2O_3$,
the first material is $Gd_2O_3$ and the second material is $Cr_2O_3$ or $La_2O_3$,
the first material is NiO and the second material is SrO, CaO, or BeO, or
the first material is $WO_3$ and the second material is $MoO_3$.

21. The variable resistance memory device of claim 20, wherein
the first material is $HfO_2$, and
the second material is $TiO_2$, $MnO_2$, $ZrO_2$, $SiO_2$, or $Cr_2O_3$.

22. The variable resistance memory device of claim 20, wherein
the first material is $Gd_2O_3$, and
the second material is $Cr_2O_3$ or $La_2O_3$.

23. The variable resistance memory device of claim 20, wherein
the first material is NiO, and
the second material is SrO, CaO, or BeO.

24. The variable resistance memory device of claim 14, wherein
the first material is $WO_3$, and
the second material is $MoO_3$.

25. A variable resistance memory device comprising:
an insulating layer;
the variable resistance memory device of claim 20 on the insulating layer;
a channel layer on the variable resistance layer;
a gate insulating layer on the channel layer; and
a plurality of gate electrodes spaced apart from another on the gate insulating layer, wherein
the first conductive element and the second conductive element are two of the plurality of gate electrodes.

* * * * *